(12) United States Patent
Shine

(10) Patent No.: US 7,321,320 B2
(45) Date of Patent: Jan. 22, 2008

(54) DSV CONTROL APPARATUS AND DSV CONTROL METHOD

(75) Inventor: Hiroyuki Shine, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/497,260

(22) Filed: Aug. 2, 2006

(65) Prior Publication Data
US 2007/0030193 A1    Feb. 8, 2007

(30) Foreign Application Priority Data
Aug. 5, 2005    (JP)    ............................. 2005-228235

(51) Int. Cl.
*H03M 7/00*    (2006.01)
(52) U.S. Cl. .......................................... 341/58; 341/59
(58) Field of Classification Search .................. 341/58, 341/59, 50, 51
See application file for complete search history.

(56) References Cited

U.S. PATENT DOCUMENTS 7,142,135 B1 * 11/2006 Chen et al. .................... 341/59

FOREIGN PATENT DOCUMENTS

JP    11-346154 A    12/1999
JP    2003-179497 A    6/2003

* cited by examiner

*Primary Examiner*—Rexford Barnie
*Assistant Examiner*—Joseph Lauture
(74) *Attorney, Agent, or Firm*—Sughrue Mion, Pllc.

(57)    ABSTRACT

A digital sum value (DSV) control apparatus inserts a DC control bit for each DC control block. The apparatus includes a first DSV accumulated value comparator for setting a target flag to a DC control bit for a first DC control block, a second DSV accumulated value comparator for comparing a first DSV accumulated value accumulated and calculated from DSV values of the first DC control block with a second DSV accumulated value accumulated and calculated from DSV values of a plurality of DC control blocks subsequent to the first DC control block, and a DC control bit determination output section for determining a value of a DC control bit for the first control block according to an output of the first and the second DSV accumulated value comparators.

14 Claims, 12 Drawing Sheets

US 7,321,320 B2

DSV CONTROL APPARATUS AND DSV CONTROL METHOD

BACKGROUND OF THE INVENTION

1. Field of the Invention

The present invention relates to DSV control apparatus and DSV control method that controls a digital sum value (DSV) to minimize DC (Direct Current) component of input data to generate the data appropriate for transmission or recording to a recording medium.

2. Description of Related Art

When data is recorded to a recording medium such as a magnetic disc, an optical disc, or a magnetic optical disc, it is modulated in appropriate form for the recording. The data is encoded by a modulation method corresponding to their specifications.

When the code created by the modulation is recorded on an optical disc or a magnetic optical disc, Non Return to Zero Inverted (NRZI) encoding is performed. With the NRZI modulation for generating a recording code, a logic 1 is encoded as inverted, and a logic 0 is encoded as non-inverted. The recording to a recording medium such as a disc is performed based on the NRZI recording code.

In the recording to a recording medium, the encoding modulation appropriate for each medium is performed. If DC component is contained in the modulation code, it causes variation in error signals and jitter to occur. The DC component is thus preferably minimized.

To meet this need, the control of a digital sum value (DSV) is performed. DSV is defined as a sum of values when the value of +1 is assigned to the "1" states and the value of −1 is assigned to the "0" states respectively in a code sequence. DSV gives an indication of DC component in the code sequence. Minimizing the absolute value of DSV by performing DSV control suppresses the DC component of the code sequence.

The technique of performing DSV control by inserting DSV control bits when creating a recording code is disclosed for example in Japanese Unexamined Patent Publications Nos. 11-346154, 2003-179497, and so on.

The present invention, however, has recognized that the DSV control method disclosed in therein have a problem that, for some patterns of encoded data, insertion of DSV control bits for DSV control does not lead to a decrease in the absolute value of a sum of values of a code sequence but only diverges the value.

SUMMARY OF THE INVENTION

According to an aspect of the present invention, there is provided a digital sum value (DSV) control apparatus that inserts a DC (Direct Current) control bit for each DC control block, which includes a first DSV accumulated value comparator for setting a target flag to a DC control bit for a first DC control block, a second DSV accumulated value comparator for comparing a first DSV accumulated value accumulated and calculated from DSV values of the first DC control block with a second DSV accumulated value accumulated and calculated from DSV values of a plurality of DC control blocks subsequent to the first DC control block, and a DC control bit determination output section for determining a value of a DC control bit for the first control block according to an output of the first and the second DSV accumulated value comparators.

According to another aspect of the present invention, there is provided a DSV control apparatus that inserts a DC control bit for each DC control block, which includes a DSV calculator for accumulating and calculating a DSV value of a DC control block and outputting a calculation result, a first DSV accumulated value comparator for comparing the calculation result of the DSV calculator with a first DSV accumulated value stored in a DSV accumulated value storage that stores the calculation result of the DSV calculator, and setting a target flag to a DC control bit for a DC control block according to a comparison result, a second DSV accumulated value comparator for calculating a plurality of second DSV accumulated values of a DC control block corresponding to a DC control bit for which the target flag is set and a plurality of DC control blocks subsequent to the DC control block and comparing the plurality of second DSV accumulated values, and a DC control bit determination output section for determining a value of a DC control bit for which the target flag is set according to an output of the first and the second DSV accumulated value comparators.

According to still another aspect of the present invention, there is provided a DSV control method that inserts a DC control bit for each DC control block, which includes setting a target flag to a DC control bit for a first DC control block, comparing DSV accumulated values of the first DC control block and a plurality of DC control blocks subsequent to the first DC control block, and determining a value of a DC control bit for the first control block according to a comparison result of the DSV accumulated values.

According to yet another aspect of the present invention, there is provided a DSV control method that inserts a DC control bit for each DC control block, which includes performing first calculation by accumulating a DSV value of a DC control block, performing first comparison by comparing a calculation result of the first calculation with a stored first DSV accumulated value, setting a target flag to a DC control bit for an arbitrary DC control block according to a result of the first comparison, performing a second comparison by comparing a plurality of second DSV accumulated values of a DC control block corresponding to a DC control bit for which the target flag is set and a plurality of DC control blocks subsequent to the DC control block, and determining a value of a DC control bit for which the target flag is set according to results of the first and the second comparisons.

The present invention efficiently prevents the divergence of DSV.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

The application of the modulation method according to an embodiment of the present invention is not particularly limited, but the principle of the method is described hereinafter, taking a Blu-ray disc® for example. Before describing the present invention, the data structure, modulation and so on of a Blu-ray disc® are briefly described to facilitate understanding.

Figure 1:
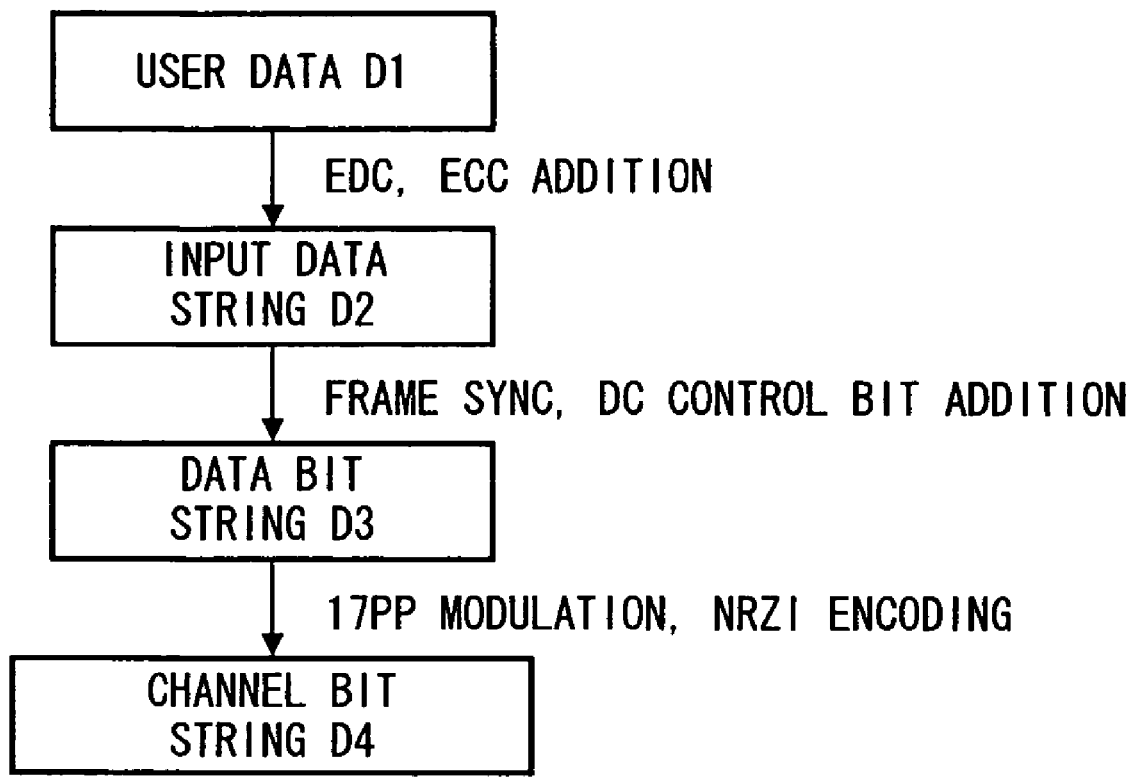
FIG. 1 is a view showing stages of data on a Blu-ray disc®.

FIG. 1 illustrates each stage of modulation on a Blu-ray disc®. In the modulation on a Blu-ray disc®, an error detection code (EDC) and an error correction code (ECC) are added to user data D1 as the data to be recorded onto a disc, and the EDC and ECC added data are then encoded in a predetermined format. The encoded data is referred to herein as an input data string D2.

The input data string D2 is then added with a synchronous signal, which is called frame sync, and a DC control bit. The DC control bit is a bit that is added for DSV control. The data added with the DC control bit are referred to herein as the data bit string D3.

The data bit string D3 is then 17PP modulated and NRZI encoded, and finally written to the disc. The data actually written to the disc is referred to herein as the channel bit string D4.

Figure 2:
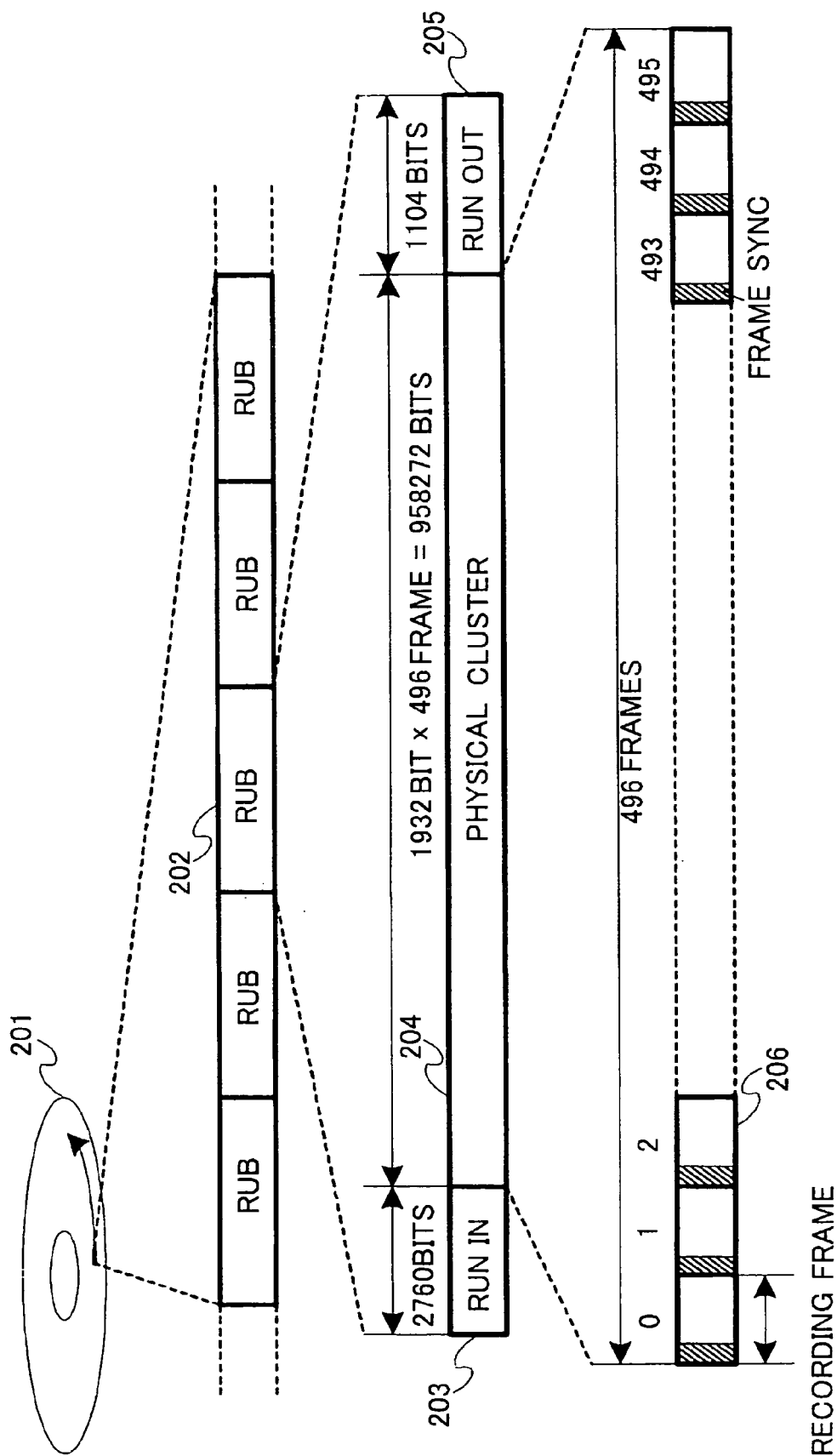
FIG. 2 is a view showing a data structure of a Blu-ray disc®.

The data structure of a Blu-ray disc® is defined as below. FIG. 2 is a view to describe the data structure of a Blu-ray disc®. In Blu-ray disc® specification, a recording unit block (RUB) 202 is a unit of recording. Data is recorded on a disc 201 as a group of recording units RUB 202.

Each RUB 202 includes a run-in 203, a run-out 205, and a physical cluster 204 that are placed therebetween.

The physical cluster 204 is an area for recording user data and a bust indicator subcode (BIS code). The BIS code is data that indicates address information of a disc. The physical cluster 204 is made up of 496 recording frames 206. Each recording frame 206 has the above-mentioned frame sync at its head.

The run-in 203 and the run-out 205 are a buffer area and a gap area for data overwrite. The run-in 203 and the run-out 205 together have a data length corresponding to two recording frames.

Thus, 1 RUB 202 is formed of 498 frames, a sum of the 496 recording frames 206 forming the physical cluster 204, and the run-in 203 and the run-out 205 corresponding to two recording frames. The data written to the physical cluster 204 is the channel bit string D4 that is encoded for recording.

Figure 3:
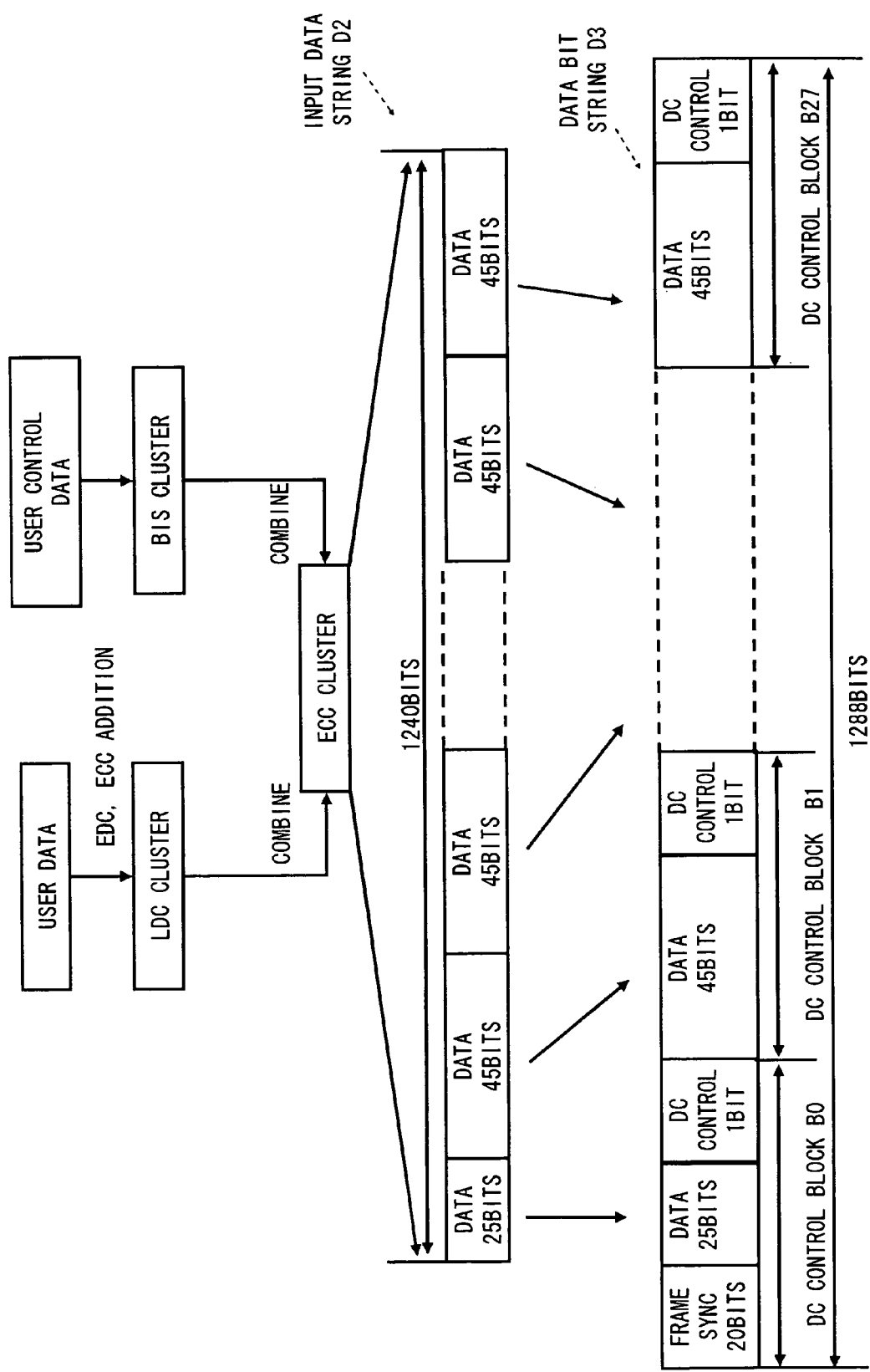
FIG. 3 is a view showing the encoding on a Blu-ray disc®.

FIG. 3 illustrates the encoding sequence of each data to create the channel bit string D4 from user data and its address information. The encoding is described in further detail herein with reference to FIG. 3.

An encoding of this embodiment first generates a long distance code (LDC) cluster and a BIS cluster from user data, user control data and so on. The LDC cluster is generated by adding EDC and ECC to user data. In addition to the LDC cluster, BIS cluster is generated from user control data or the like. The LDC cluster and the BIS cluster are combined to create an ECC cluster. The ECC cluster is equivalent to the input data string D2 in FIG. 1. The input data string D2 that corresponds to one recording frame described above has 1240 bits.

The process then adds a synchronous signal (frame sync) and a DC control bit to the input data string D2 to create a data bit string D3. The frame sync that is added to one recording frame has a data length of 20 bits. One DC control bit is added for every 45 bits including 20 bits of frame sync, which creates a DC control block. There are (1240+20)/45=28 DC control blocks in each recording frame. The data bit string D3 that includes the frame sync and the DC control bit has 46*28=1288 bits for one frame.

The process further performs 17PP modulation on the 496 frames of data bit string and the process adds the run-in and run-out to the 496 frames of data bit string, thereby creating one RUB. The RUB is NRZI encoded to create the channel bit string D4, which is data to be written on a disc. The 17PP modulation converts 2-bit data to 3-bit data and therefore the channel bit string corresponding to one recording frame has 1932 bits after the modulation. Table 1 below shows a part of a modulation table used for the 17PP modulation.

TABLE 1

| No. | data bits | modulation bits | condition |
|-----|-----------|-----------------|-----------|
| 1 | 00 00 00 00 | 010 100 100 100 | |
| 2 | 00 00 10 00 | 000 100 100 100 | |
| 3 | 00 00 00 | 010 100 000 | |
| 4 | 00 00 01 | 010 100 100 | |
| 5 | 00 00 10 | 000 100 000 | |
| 6 | 00 00 11 | 000 100 100 | |
| 7 | 00 01 | 000 100 | |
| 8 | 00 10 | 010 000 | |
| 9 | 00 11 | 010 100 | |
| 10 | 01 | 010 | |
| 11 | 10 | 001 | |
| 12 | 11 | 000 | if preceding modulation bits = xx1 |
| 13 | 11 | 101 | if preceding modulation bits = xx0 |

On a digital versatile disc (DVD), the DSV control inserts a DC control bit into a channel bit string that is encoded for recording. On a Blu-ray disc®, on the other hand, modulation is performed so that calculation of parity bits results in the same for the data bit string D3 before encoding and the channel bit string D4 after encoding. The DSV control on the Blu-ray disc® uses this and inserts a DC control bit into the input data string D2 at certain intervals to thereby suppress the divergence of DSV, as described above. This exemplary embodiment described the case of performing DSV control before performing the encoding for recording.

Figures 4A, 4B:
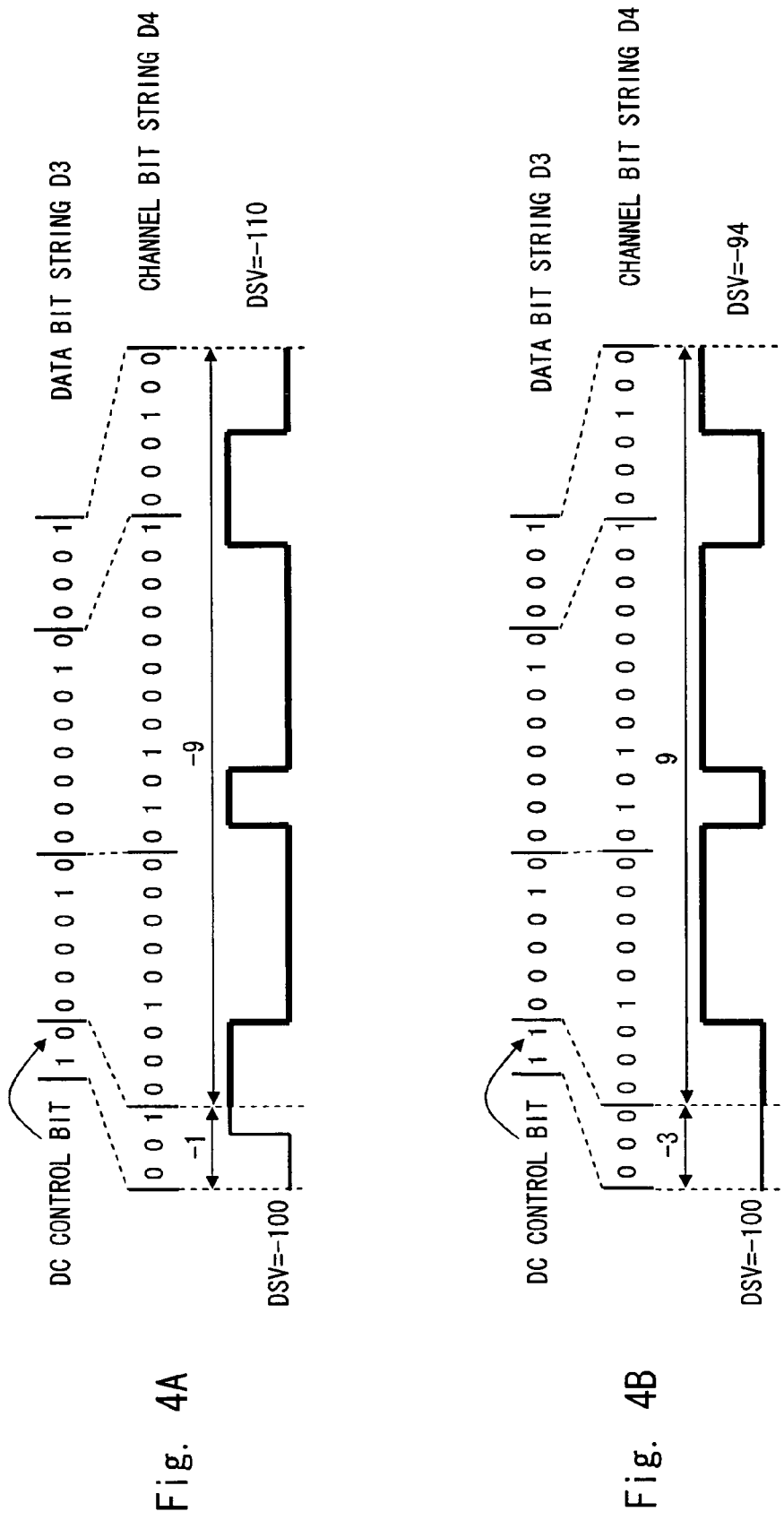
FIGS. 4A and 4B are view to describe a DSV control apparatus.

In light of the foregoing, a basic DSV control on Blu-ray disc® specification is described herein. FIGS. 4A and 4B illustrate the data bit string D3 and the channel bit string D4 after modulation on a Blu-ray disc®. FIGS. 4A and 4B show the case when the DSV accumulated value of the channel bit string at the left end of the drawing is −100. FIG. 4A shows the case where "0" is inserted as a DC control bit. When "0" is inserted as a DC control bit, the DSV accumulated value at the right end of the drawing becomes −110. FIG. 4B shows the case where "1" is inserted as a DC control bit. When "1" is inserted as a DC control bit, the bits in the channel bit string D4 subsequent to the inserted DC control bit are inverted, and the DSV accumulated value at the right end of the drawing becomes −94. As shown in FIGS. 4A and 4B, the insertion of the DC control bit "1" enables reduction of the absolute value of the DSV accumulated value from 100 to 94, thereby suppressing the divergence of the DSV accumulated value. The Blu-ray disc® specification basically implements such a DC control bit insertion.

In each of FIGS. 4A and 4B, the DC control bit and the immediately preceding bit in the data bit string D3 are converted to 3-bit data for 17PP modulation.

A DSV control apparatus according to an exemplary embodiment of the present invention is described hereinbelow with reference to FIG. 5. An input section 501 receives the input data string D2 from outside and supplies it to a DC control bit generator 502 and a delay circuit 503.

The DC control bit generator 502 determines "1" or "0" as a DC control bit to be inserted to the received input data string D2 and supplies the result to a DC control bit insert section 504.

The delay circuit 503 temporarily stores the received input data string D2 to a buffer or the like in the delay circuit 503 and, after a predetermined period of delay time, supplies the input data string D2 to the DC control bit insert section 504. The delay circuit 503 thereby adjusts the timing of transmitting the input data string D2 to the DC control bit insert section 504.

The predetermined period of delay time is set according to the timing when the DC control bit insert section 504 inserts the DC control bit determined by the DC control bit generator 502 into a prescribed position of the input data string D2 that is output from the delay circuit 503.

The DC control bit insert section 504 receives the input data string D2 that is supplied from the delay circuit 503 and the DC control bit determination result (the determination whether "0" or "1") that is supplied from the DC control bit generator 502 at a prescribed timing, and inserts the DC control bit into a prescribed position of the received input data string D2. At the same time, the frame sync is also inserted to create the data bit string D3. The DC control bit insert section 504 supplies the data bit string D3 to the 17PP modulator 505.

The 17PP modulator 505 modulates the data bit string D3 to a code string in accordance with a predetermined conversion rule as shown in Table 1, for example. After that, the code string is then added with a part of a synchronous signal by a synchronous signal insert section 506, and supplied to a NRZI encoder 507.

The NRZI encoder 507 perform NRZI encoding to convert the code string supplied from the synchronous signal insert section 506 into a recording code string (channel bit string D4) and output the channel bit string D4 to outside.

The DSV control method implemented by the DSV control apparatus according to this embodiment is described hereinafter. With the DSV control method described above with reference to FIG. 4, when determining a DC control bit in units of DC control block, the DSV accumulated value can be divergent regardless of the input DC control bit ("0" or "1") for some patterns of the input data string D2.

Figure 6:
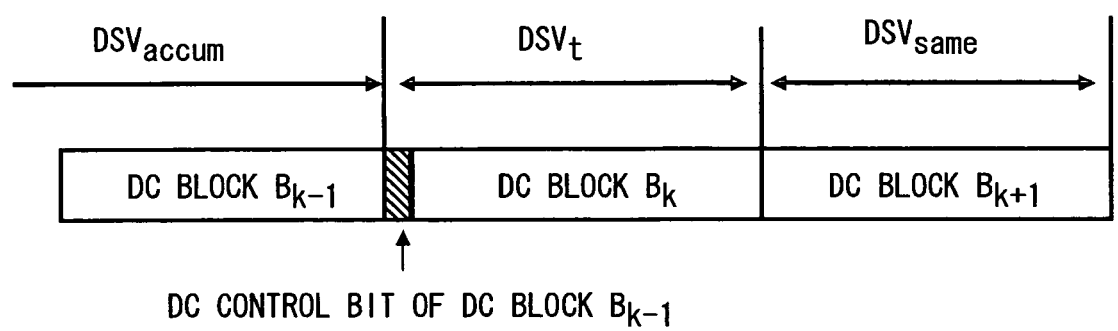
FIG. 6 is a view to describe an overview of a DSV control apparatus according to an embodiment of the invention.

If such patterns are input in succession, the use of the method of FIG. 4 can only result in the divergence of DSV. To avoid this, this embodiment suppresses the divergence of DSV by using the following technique. To start with, the overview of the DSV control according to this embodiment is described herein. FIG. 6 schematically shows a view to describe the overview of the DSV control, which illustrates successive DC control blocks. It is assumed in FIG. 6 that the divergence is likely to occur in the DC control block $B_k$ regardless of the input DC control bit. The process of this embodiment is as below in principle.

1. Set a flag on the DC control bit that is inserted to the DC control block where DSV is likely to diverge regardless of the value of DC control bit. This flag is referred to herein as the target flag. In the example of FIG. 6, the DC control bit with the flag is the 46th bit of the DC control block $B_{k-1}$, which is the DC control bit for the DC control block $B_k$. Further, store the DSV accumulated values up to the DC control block $B_k$ for which the target flag is set both when the DC control bit is "0" and "1".

2. Calculate DSV for the DC control blocks subsequent to the DC control block $B_k$ where DSV is likely to diverge. Stated differently, calculate the DSV accumulated values of the DC control block $B_{k+1}$ and subsequent blocks.

3. Determine the DC control bit of the DC control block $B_{k-1}$ with the target flag so as to minimize the absolute value of the overall DSV in consideration of the DSB accumulated values up to the DC control block $B_k$ for which the target flag is set and the DSV accumulated values of the subsequent DC control blocks.

4. If DSV does not diverge in the DC control block, perform the DSV control as shown in FIG. 4.

Specifically, the process is as below in the example shown in FIG. 6. In the example of FIG. 6, the target flag is set for the DC control block $B_k$. The DC control bit effective for the DC control block $B_k$ is the 46th bit of the DC control block $B_{k-1}$. Thus, the DSV accumulated values up to the DC control block $B_k$ are calculated both when the 46th bit of the DC control block $B_{k-1}$ is "0" and "1" and the information is stored.

The DC control bit at the 46th bit of the DC control block $B_k$ is "0" or "1" according to the boundary position for modulation in the the DC control block $B_k$. The 17PP modulation implements variable encoding. Therefore, if the value of the DC control bit at the 46th bit of the DC control block $B_{k-1}$ with the target flag is different, the modulation boundary can be different in the DC control block $B_k$. However, it is often the case in some data that even if the modulation boundary is temporarily present differently, it appears in the same position after that. Further, the 17PP modulation is performed on every two successive bits, and if the second bit of the two successive bits is "1", the modulation boundary is present at this position without exception. Thus, if the DC control block $B_k$ is the block for which the target flag is set, by forcibly setting the DC control bit at the 46th bit of the DC control block $B_k$ to "1", it is possible to forcibly set the modulation boundary between the DC control block $B_k$ and $B_{k+1}$. In the processing of every two bits, the 45th bit and the 46th bit are "1". Because no change occurs in the data bit string D3 itself, the subsequent modulation boundary appears in the same position.

In the case where it is unsuitable to forcibly set the DC control bit at the 46th bit of the DC control block $B_k$ to "1" for circuit design, it is possible not to set the target flag to the DC control bit at the 46th bit of the DC control block $B_{k-1}$ and to set the target flag only when the modulation boundary is back to the same position in the DC control block $B_k$.

Thus, when focusing on the DC control block $B_k$ only, there are cases when the divergence of DSV accumulated values cannot be suppressed regardless of the DC control bit at the 46th bit of the DC control block $B_{k-1}$. In such a case, the DSV control method of this embodiment determines the DC control bit at the 46th bit of the DC control block $B_{k-1}$ in view of the DSV value of the DC control block $B_{k+1}$ and subsequent blocks. Because it is possible to control so that the modulation boundaries of the DC control block $B_{k+1}$ and subsequent blocks appear in the same positions when needed, the polarity of the DSV value of the DC control block $B_{k+1}$ and subsequent blocks can be changed in accordance with the change in the DC control bit at the 46th bit of the DC control block $B_{k-1}$. This consequently enables suppression of overall divergence of DSV accumulated values. Therefore, this embodiment sets the target flag to the DC control bit for the DC control block $B_k$ (i.e. the DC control bit at the 46th bit of the DC control block $B_{k-1}$) and stores the DSV information, which is detailed later, up to the DC control block $B_k$. Then, in view of the DSV values of a plurality of DC control blocks, it determines the DC control bit at the 46th bit of the DC control block $B_{k-1}$.

Figure 7:
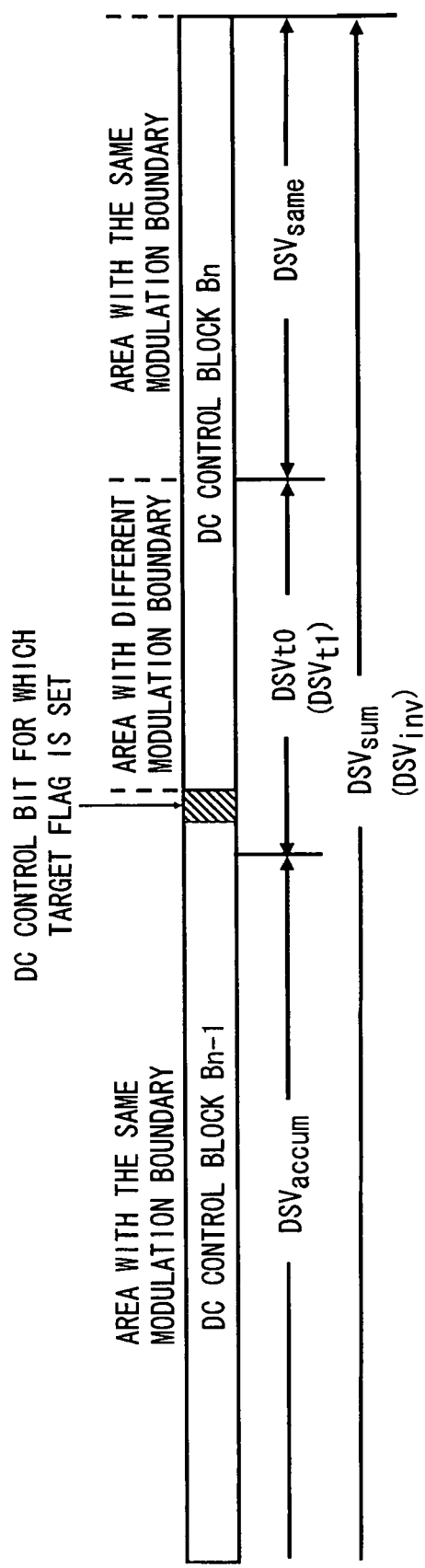
FIG. 7 is a view to describe an overview of a DSV control apparatus according to an embodiment of the invention.

The DSV control of this embodiment is described in further detail below. FIG. 7 schematically illustrates a DC control block for calculating the value of DSV according to this embodiment. It is assumed in FIG. 7 that the position of the modulation boundary is different in the DC control block $B_n$, for example, to cause the values of DSV to diverge regardless of the value of the DC control bit. In order to generalize the equation described later, FIG. 7 illustrates the DC control block $B_n$ as the block having the area where the divergence cannot be controlled by the DC control bit, it is the same in principal as the DC control blocks $B_{k-1}$, $B_k$, and $B_{k+1}$ shown in FIG. 6.

The DSV accumulated values are examined hereinbelow, taking the case of FIG. 7 for example. $DSV_{accum}$ indicates the DSV accumulated value up to the DC control block $B_{n-1}$. $DSV_{sum}$ indicates the DSV accumulated value of the whole channel bit string when the DC control bit is "0", for example. $DSV_{inv}$ indicates the DSV accumulated value of the whole channel bit string when the DC control bit at the 46th bit of the DC control block $B_{n-1}$ is inverted (e.g. "1"). $DSV_{t0}$ indicates the DSV value of the area where the modulation boundary is different when the DC control bit is "0", for example. $DSV_{t1}$ indicates the DSV value of the area where the modulation boundary is different when the DC control bit is "1", for example. $DSV_{same}$ indicates the DSV value of the area where the modulation boundary is the same. FIG. 7 shows:

When the DC control bit is "0", $$DSV_{sum}=DSV_{accum}+DSV_{t0}-DSV_{same} \quad (1)$$

When the DC control bit is "1", $$DSV_{inv}=DSV_{accum}+DSV_{t1}+DSV_{same} \quad (2)$$

In the above equations (1) and (2), the term of $DSV_{same}$ has the same absolute value and its polarity simply changes according to DC control bit. Thus, the DSV accumulated value $DSV_{inv}$ when the DC control bit is inverted and the DSV accumulated value $DSV_{sum}$ when the DC control bit is not inverted have the relationship represented by the following equation:

$$DSV_{inv}=DSV_{accum}+DSV_{t1}+DSV_{accum}+DSV_{t0}-DSV_{sum} \quad (3)$$

Figure 12:
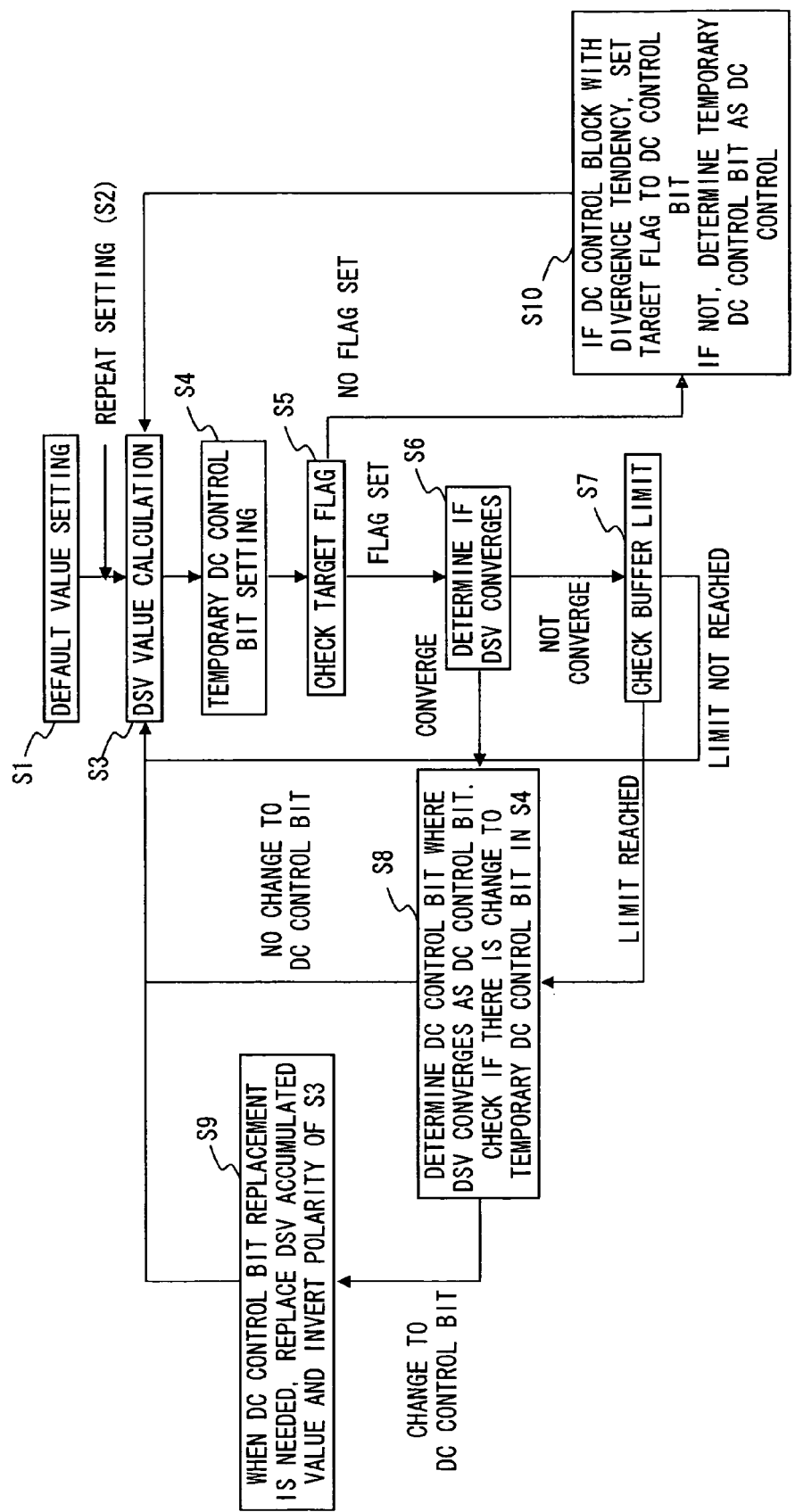
FIG. 12 is a flowchart showing a DSV control process according to an embodiment of the invention.

The relationship of (3) is also effected for other conditions such as when $DSV_{t0}$ corresponds to the DC control bit of "1", and $DSV_{t1}$ corresponds to the DC control bit of "0". Based on the relationship of (3), this embodiment performs DSV control according to the process described below. FIG. 12 is a flowchart showing the process described hereinbelow. The DSV control process of this embodiment is described with reference to FIG. 12.

Step S1 (Default Value Setting)
The value of DSV at the start of recording is set to "0", and the DSV accumulated value that is obtained by modulating the data up to the DC control bit of the first DC control block for which DSV control is performed is set as a DSV default value for the DSV control. The physical cluster is particularly described in the following.

Step S2 (Repeat Setting)
In the subsequent DC control block $B_n$, the operation after Step S3 is performed repeatedly. One recording frame includes 28 DC control blocks $B_0$ to $B_{27}$. In this embodiment, the operation after Step S3 is repeated for 31 recording frames. The 31 recording frames correspond to one sector in Blu-ray disc® specification, though the detail of the sector is not described herein.

Step S3 (DSV Calculation)
The values of DSV are accumulated from the 45th and 46th bits of the DC control block $B_{n-1}$ to the 44th bit of the DC control block $B_n$ for each of the cases when the DC control bit of the DC control block $B_{n-1}$ is set to "0" and "1".

Step S4 (DC Control Bit Determination (Temporary Setting))
The DSV control of this embodiment temporarily sets the one of two sequencers of the DC control block which has a smaller absolute value of DSV accumulated value as the DC control bit at the 46th bit of the DC control block $B_{n-1}$. However, if the target flag is ON and the absolute value of the DSV accumulated value exceeds a certain reference value, it is possible to select the one with a larger absolute value as the DC control bit. When selecting the DC control bit, the calculation in the following step S3 is performed based on the polarity of the selected DC control bit, regardless of the selection of the absolute value.

Step S5 (Target Flag Reference)
After Step S4, the process of this embodiment refers to the target flag. If the target flag is ON, the process proceeds to Step S6; otherwise, it performs the operation of Step S10.

Step S6 (DSV Convergence Determination)
If Step S5 founds the DC control bit for which the target flag is set, the process then calculates the DSV accumulated value, including the subsequence DC control blocks and determines whether the DSV value converges or not. Specifically, it calculates $DSV_{inv}$ by using the above equation (3). If the calculation results that $DSV_{sum}$ or $DSV_{inv}$ is smaller than the DSV accumulated value $DSV_{tgt}$ up to the DC control bit for which the target flag is set ($DSV_{tgt}>DSV_{sum}$ or $DSV_{tgt}>DSV_{inv}$), the process determines that the DSV value converges and proceeds to Step S8. If the DSV value does not converge, it proceeds to Step S7.

Figure 5:
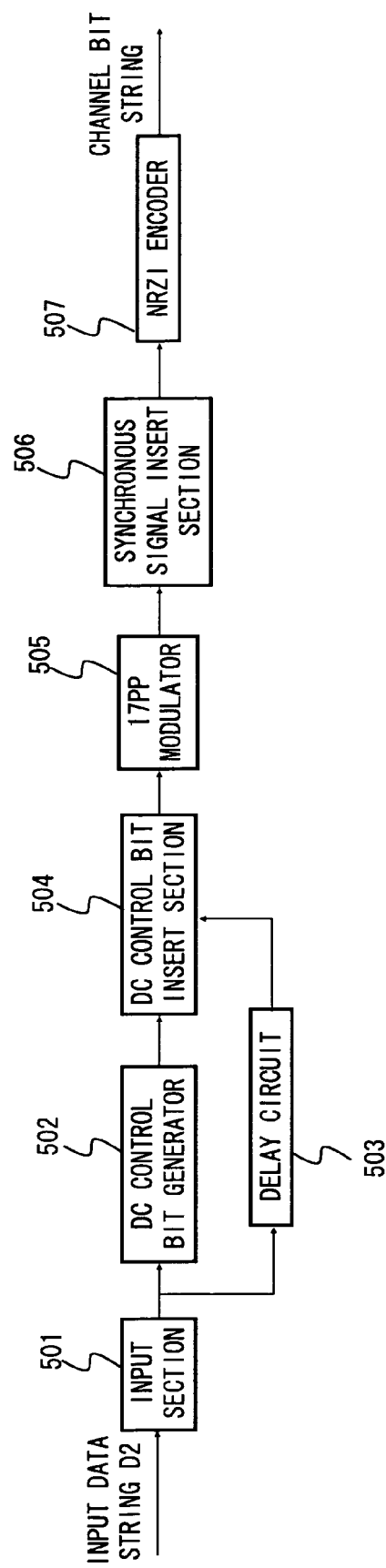
FIG. 5 is a view showing a DSV control apparatus according to an embodiment of the invention.

Step S7 (Buffer Capacity Reference)
If the capacity of the buffer in the delay circuit 503 in FIG. 5 is at its limit, it is necessary to determine the DC control bit. Thus, the process checks the buffer capacity in this step. If it is at its limit, the process proceeds to Step S8 and otherwise returns to Step S3.

Step S8 (DC Control Bit Determination)
If Step S6 determines that the DSV value converges, the process then selects the DC control bit with which the value converges and determines it as the DC control bit. Further, if Step S7 determines that the buffer capacity is at its limit, the process then calculates $DSV_{inv}$ when the targeted DC control bit is inverted according to the equation (3). If it is the buffer's limit, it determines the DC control bit that reduces the DSV absolute value as the DC control bit. After determining the DC control bit, if the inversion is needed for the DC control bit that is temporarily set by Step S4, the process proceeds to Step S9. If the inversion is not needed for the DC control bit that is temporarily set by Step S4, the process returns to Step S3. Because the DC control bit is determined in this step, the target flag is set OFF.

Step S9 (DC Control Bit Inversion)

The targeted DC control bit is inverted in this step. The process replaces the value of the DSV accumulated value with the DSV value that is calculated in Step S6 or S8. It further inverts the polarity for the DSV calculation performed in Step S3 and returns to Step S3.

Step S10 (Target Flag Setting or Repeat Calculation)

If the target flag is OFF in Step S5 and the absolute value of the DSV accumulated value up to the 44th bit of the DC control block $B_{n-1}$ is smaller than or equal to the absolute value of the DSV accumulated value up to the 44th bit of the DC control block $B_n$, the process determines the DC control bit that is temporarily set in Step S4 as the DC control bit and returns to Step S3. If the DSV value diverges with the DC control bit that is temporarily set in Step S4, when the modulation boundary is the same at the completion of the operation of Step S4, the process sets the target flag to the DC control bit at the 46th bit of the DC control block $B_{n-1}$, stores the information different from the DSV that is required for the calculation of $DSV_{inv}$ in the equation (3), and returns to Step S3. Even if the DSV value tends to diverge, when the modulation boundary is different at the completion of the operation of Step S4, the process returns to Step S3 without setting the target flag.

In this way, the process of this embodiment sets the target flag to the DC control block where the DSV accumulated value tends to diverge. When the target flag is set, it performs DSV control on the block and the several subsequent DC control blocks, and determines the DC control bit for the DC control block for which the target is set. This enables suppression of divergence of the DSV accumulated value.

The above description describes the process flow that does not forcibly set the modification boundary at the same position. However, with the flow that forcibly sets the modification boundary at the same position, for example, it is possible to add the step that forcibly sets the DC control bit of the DC control block $B_n$ to "1" after Step S3.

Figure 8:
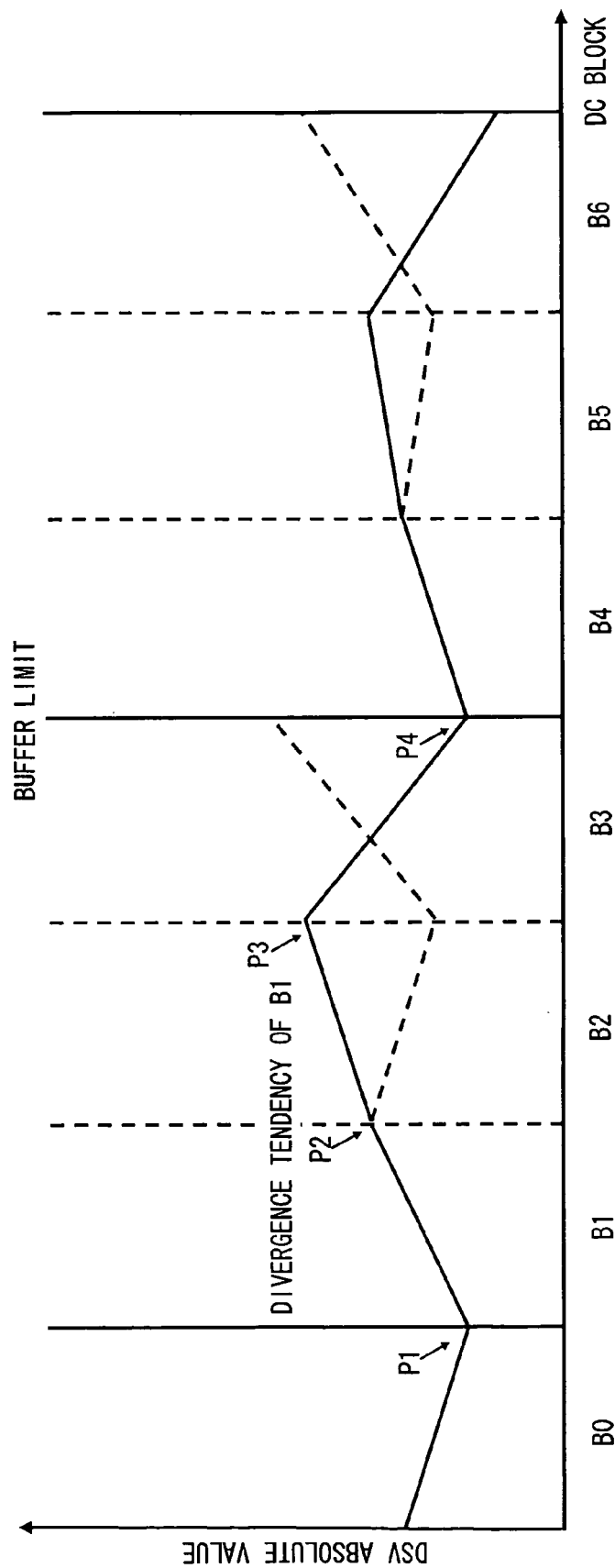
FIG. 8 is a view to describe an operation of a DSV control apparatus according to an embodiment of the invention.

The operation of the present invention is described hereinafter using image views. FIG. 8 schematically shows the DSV value for each DC control block. Though the actual DSV values continuously change every one bit, the graph of FIG. 8 shows variation in sequential DSV accumulated values up to the 44th bit of the DC control block that are obtained by the modulation to facilitate understanding.

It is assumed that the left end of FIG. 8 indicates an initial DSV accumulated value at some point. According to the process described above, the DSV value up to the 44th bit of the DC control block B0 is calculated. In this example, it is assumed that the divergence of the DC control block B0 can be suppressed by setting the immediately preceding DC control bit to either "0" or "1". Thus, either value is selected as the DC control bit so that the DSV accumulated value decreases (cf. P1 in FIG. 8).

It is assumed that the divergence of the DSV value tends to occur regardless of the DC control bit in the subsequent DC control block B1 (cf. P2 in FIG. 8). Then, at this time, the target flag is set for the DC control bit of the DC control block B1 (corresponding to Step S10 described above; see FIG. 8). FIG. 8 indicates the DSV accumulated value at this point as one value to facilitate understanding. However, because the DSV value of the single DC control block B2 corresponds to the term of $DSV_{r0}$ or $DSV_{r1}$ in the equation (3), the pace of increase of the DSV value can vary depending on the value of the DC control bit that is determined later. For easier understanding, FIG. 8 merely shows that the value divergence appears in the DC control block B1 regardless of the DC control bit and the target flag is set therefor.

In the DC control block B2 that is input after setting the target flag, the polarity is inverted depending on the value ("0" or "1") of the DC control bit with the target flag. A change in DSV value when the DC control bit corresponding to the DC control block is temporarily set is indicated by the dotted line in FIG. 8. A change in DSV value when the DC control bit that is temporarily set for the DC control block is inverted is indicated by the full line in FIG. 8. If, for example, the DSV control apparatus shown in FIG. 5 has a buffer that can store the input data corresponding to three DC control blocks from the target flag (the 46th bit of the DC control block B0), the capacity of the buffer reaches its limit at the DC control block B3. When the limit of the buffer capacity is reached, the DC control bit corresponding to the DC control block B1 for which the target flag is set, which is the 46th bit of the DC control block B0, is set. The calculation of the DSV accumulated value is performed according to the equation (3), thereby determining the DC control bit.

In the example shown in FIG. 8, the target flag is set at the point P2 which corresponds to Step S10. At the point P3, the target flag is checked by Step S5. Because the absolute value is not smaller than the DSV accumulated value at the point P1 in FIG. 8 when the DC control bit with the target flag is set to either "0" or "1" in Step S6, the process proceeds to Step S7. Because the limit of the buffer is not reached at the point P3, the process returns to S3 to repeat the calculation while maintaining the temporary DC control bit.

Because the buffer capacity reaches its limit at the point P4 of FIG. 8, the process proceeds to Step S8 to determine the DC control bit for which the target flag is set. At this time, the absolute value of the DSV accumulated value (cf. the full line in FIG. 8) of the inverted temporary DC control bit is smaller than the absolute value of the DSV accumulated value (cf. the dotted line in FIG. 8) based on the temporary DC control bit at the point P4 of FIG. 8. Therefore, the DC control bit is inverted, and the processing accompanying the inversion is performed in Step S9. The process then returns to Step S3 and repeats the process.

In the graph shown in FIG. 8, the DSV accumulated value (full line) of the inverted temporary DC control bit is smaller than the DSV accumulated value (dotted line) using the temporary DC control bit at the point when the buffer's limit is reached. Therefore, the DSV control apparatus of this embodiment inverts the DC control bit. Because the DC control block Bs is at the buffer's limit, the target flag is remove at this time. It is feasible to remove the target flag before the buffer's limit is reached if the DSV value at some point falls below the DSV value up to the DC control block with the target flag.

For example, if the DSV accumulated value (absolute value) at the point P3 in FIG. 8 is smaller than the DSV accumulated value (absolute value) at the point P1, the process proceeds from Step S6 to Step S8 to remove the target flag.

The basic overview, process, and operation of this embodiment is as described above. In the following, the case of selecting the one with a larger absolute value as the DC control bit when the target flag is ON and the absolute value of the DSV accumulated value exceeds a certain reference value.

Figure 9:
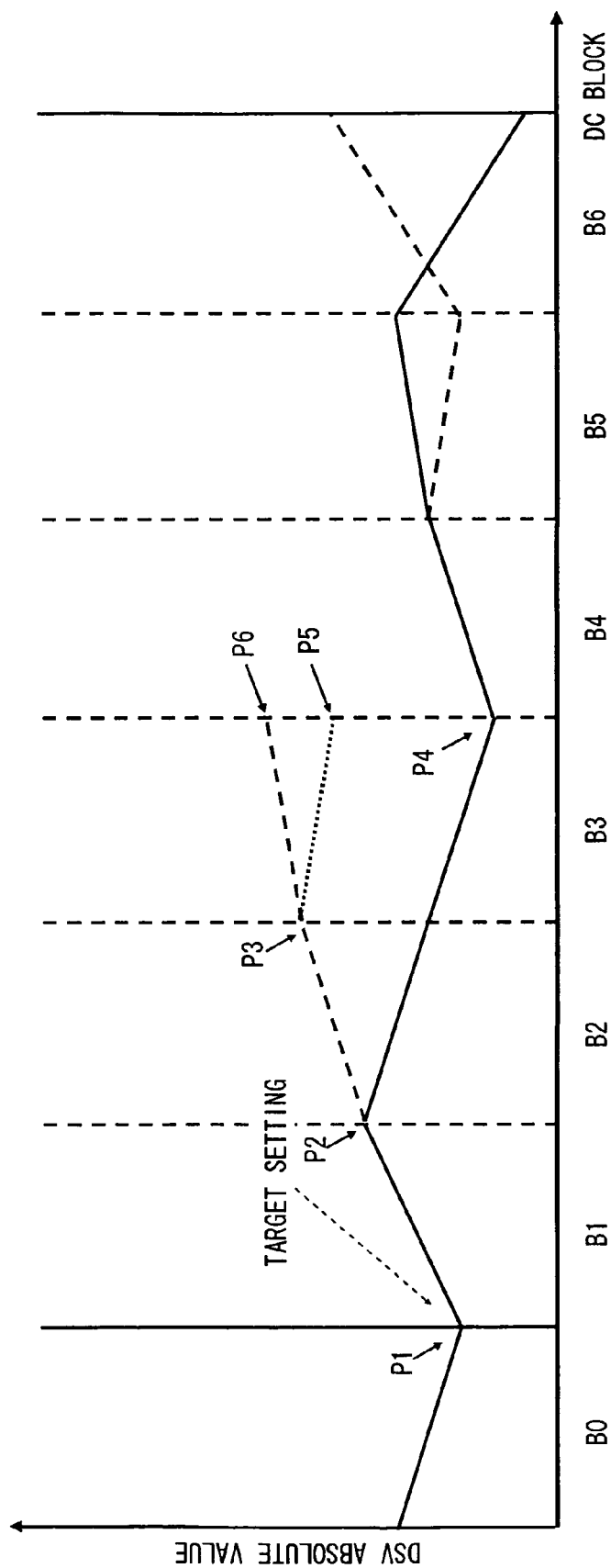
FIG. 9 is a view to describe an operation of a DSV control apparatus according to an embodiment of the invention.

FIG. 9 is a view showing the relationship between the DC control block and the DSV value that is similar to the one shown in FIG. 8. The DC control block B0 is the same as that of FIG. 8.

It is assumed that the DSV accumulated value tends to diverge regardless of the DC control block in the DC control block B1. At this time, the target flag is set for the DC control bit of the DC control block B1 (corresponding to Step S10; see P2 of FIG. 9).

A detailed description is given below with specific examples. The DSV absolute value (DSV absolute value at the point P2) up to the DC control block B1 is assumed to be 15.

The DC control blocks B2 and B3 are now focused. The DSV value of the single DC control block B2 may be −5 when the DC control bit for the DC control block B2 is "1" and +5 when it is "0", for example. The DC control bit for the DC control block B3 is the 46th bit of the DC control block B2. The DSV value may be +6 when the DC control bit for the DC control block B3 (the 46th bit of the DC control block B2) is "1" and −6 when it is "0". The normal DSV control would select "0" or "1" and controls so that the DSV value (absolute value) of a sum of the DC control blocks B2 and B3 is 1 (cf. P5 in FIG. 9). However, when setting the DC control bit for the control block B3, the target flag is ON. In such a case, it is possible to set the target flag for the DC control block so as to increase the absolute value of the term of $DSV_{same}$ (cf. P6 in FIG. 9).

For example, when such a control for increasing the absolute value is not performed, the DC control bit for the DC control block B2 is set to "0", and when the DSV value of the single DC control block B2 is +5, the control bit of −6 is set to the DC control block B3. Thus, upon completion of the accumulation up to the DC control block B3, the DSV accumulated value is 16, and the effect of reducing the absolute value of the DSV accumulated value is small (P5 of FIG. 9). However, if the DC control bit for the DC control block B3 is selected so that the absolute value of the term of $DSV_{same}$ increases, that is, the DSV value of the block B2 is +5 and the DSV value of the block B4 is +6, the DSV value for the two DC control blocks B2 and B3 is 11. After that, the DC control bit for which the target flag is set is determined, and the DSV accumulated value is 4 (=15−11). The effect of reducing the absolute value of the DSV accumulated value thereby increases (cf. P4 in FIG. 9). In this way, this embodiment can set the DC control bit in Step S4 so that the DSV control is more effective, thereby preventing the divergence of the DSV accumulated value effectively.

Figure 10:
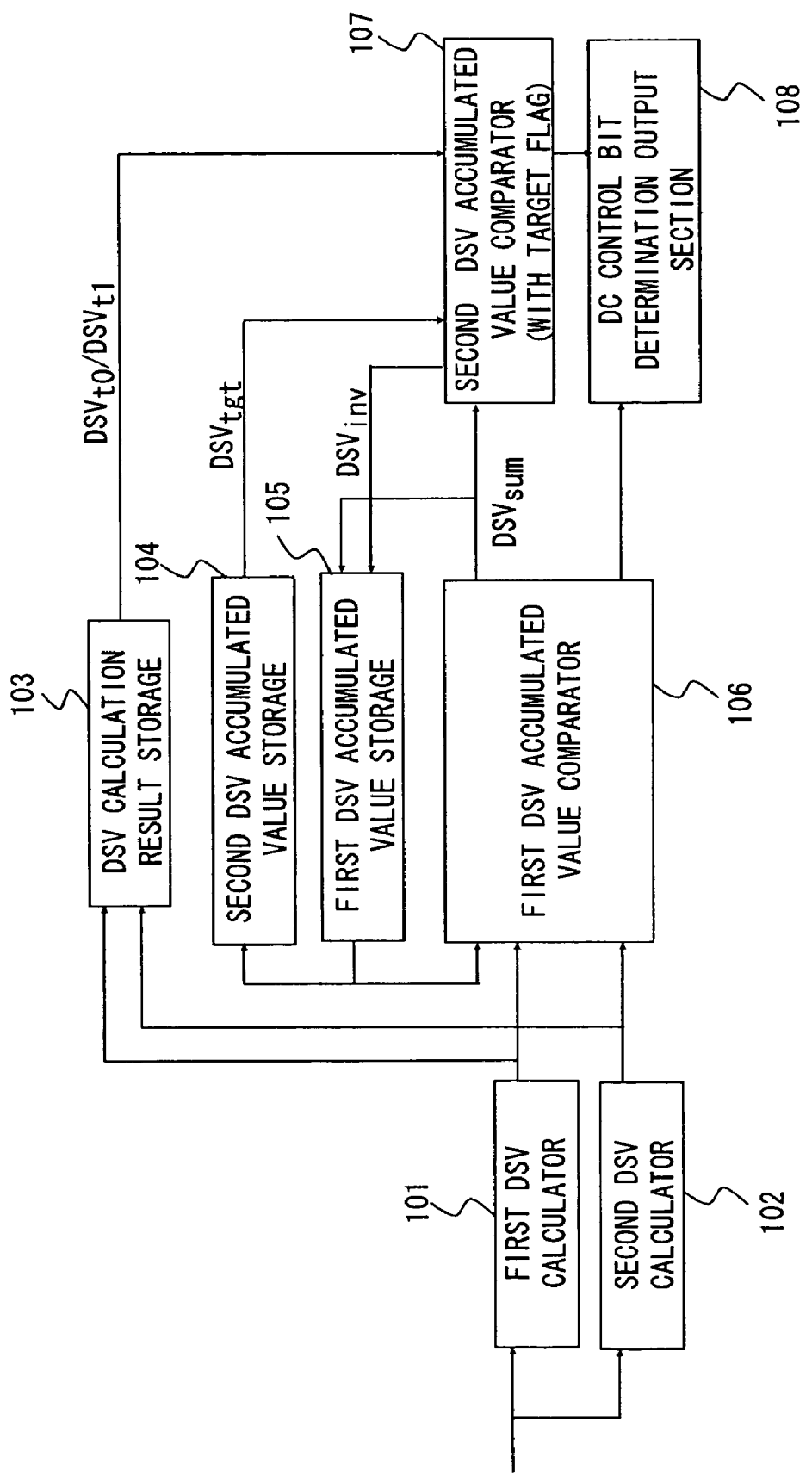
FIG. 10 is a view showing a DSV control apparatus according to an embodiment of the invention.

In view of the foregoing description, the structure of the DC control bit generator that generates the DC control bit according to this embodiment is described hereinafter. FIG. 10 is a block diagram showing the structure of the DC control bit generator 502 according to this embodiment. The DC control bit generator 502 of this embodiment includes a first DSV calculator 101, a second DSV calculator 102, a DSV calculation result storage 103, a second DSV accumulated value storage 104, a first DSV accumulated value storage 105, a first DSV accumulated value comparator 106, a second DSV accumulated value comparator 107, and a DC control bit determination output section 108.

The first DSV calculator 101 and the second DSV calculator 102 implement the calculation corresponding to Step S3 described earlier. The first DSV calculator 101 calculates a DSV accumulated value on an input data string when the DC control bit is "0", for example. The second DSV calculator 102 calculates a DSV accumulated value when the DC control bit is "1", for example. The calculation results are supplied to the DSV calculation result storage 103 and the first DSV accumulated value comparator 106. The first and second DSV calculators 101 and 102 perform the calculation based on the polarity that is set up to the immediately preceding DC control block. Therefore, if the target flag is set before that, the calculation is performed on the DC control bit with the polarity based on the temporarily set DC control bit.

The first DSV accumulated value comparator 106 implements the comparison mainly on Steps S4 and S5 and S10 described above. The first DSV accumulated value comparator 106 performs the temporary setting of the DC control bit, the setting of the target flag and so on based on the calculation results supplied from the first DSV calculator 101 and the second DSV calculator 102 and the preceding accumulated value. If the calculation results show that the DSV accumulated value does not diverge by the DC control bit of either "0" or "1", the first DSV accumulated value comparator 106 selects the DSV accumulated value with a smaller absolute value and outputs the DC control bit to the DC control bit determination output section 108. The DSV accumulated value up to the DC control block is supplied to the first DSV accumulated value storage 105.

If the first DSV accumulated value comparator 106 determines that the divergence tends to occur regardless of the DC control bit, the operation of storing the DSV accumulated value $DSV_{tgt}$ up to immediately before the DC control bit for which the target flag is set. The DSV accumulated value $DSV_{tgt}$ is supplied from the first DSV accumulated value storage 105 to the second DSV accumulated value storage 104.

The second DSV accumulated value comparator 107 implements the calculation corresponding to the equation (3), which corresponds to Steps S6 and S8 described above. The second DSV accumulated value comparator 107 includes a buffer or the like for storing the DSV value (eg. $DSV_{same}$) of the area after the target flag is set where the modulation boundary is in the same position. The calculation corresponding to the equation (3) is performed based on the calculation results (eg. $DSV_{t0}$, $DSV_{t1}$) stored in the DSV calculation result storage 103, the DSV accumulated value $DSV_{tgt}$ supplied from the second DSV accumulated value storage 104 and so on.

Based on the calculation result, the second DSV accumulated value comparator 107 determines whether the DC control bit for the DC control block for which the target flag is set is inverted or not. The determined DC control bit is supplied to the DC control bit determination output section 108. The DSV accumulated value that is fixed at this point is supplied to the first DSV accumulated value storage 105 and stored therein.

The DC control bit determination output section 108 receives the outputs of the first and the second DSV accumulated value comparators 106 and 107 and determines the final DC control bit based on the received DC control bit (corresponding to the determination in Steps S8, S9 and S10). The DC control bit determination output section 108 may also store the temporary DC control bit when the target flag is set or may invert the output from the second DSV accumulated value comparator 107 and output the result, for example.

Figure 11:
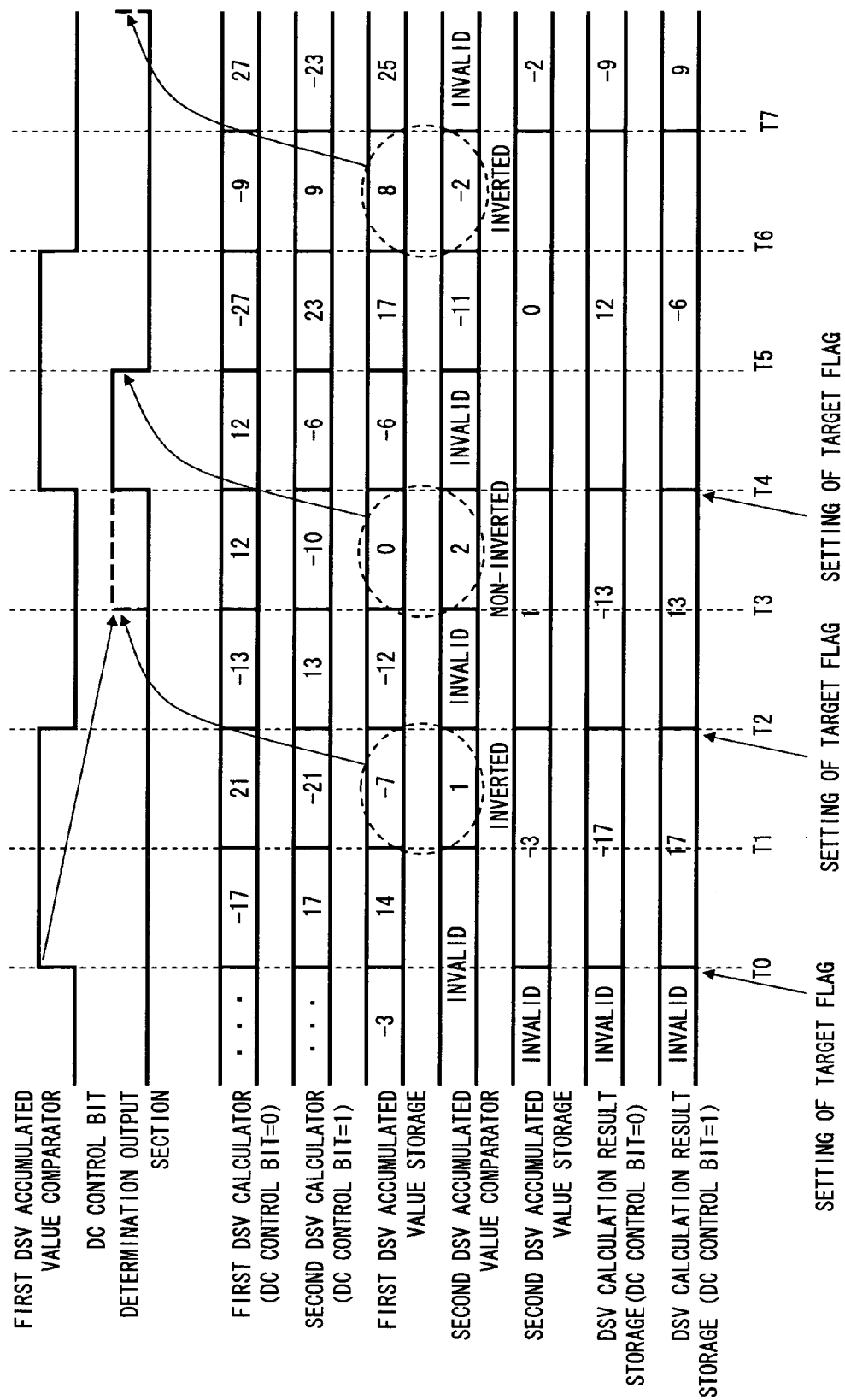
FIG. 11 is a view to describe a DSV value used for DSV control according to an embodiment of the invention.

The operation of the DC control bit generator 502 is described herein below. FIG. 11 is a timing chart showing the calculation result, the stored data and so on in each section of the block shown in FIG. 10. The following operation is based on the process that is already described earlier, and the redundant deception may be included. Still, for better understanding, the description is briefly given by reference to specific values, the values stored in each section and so on.

It is assumed herein that the DSV accumulated value up until Time t0 in FIG. 11 is −3. If the DSV value from Time t0 to t1 is −17 when the DC control bit is "0" and it is +17 when the DC control bit is "1", the DSV accumulated value tends to diverge (−20 or 14) regardless of the DC control bit selected. Thus, the target flag is set for the DC control bit immediately before Time t0 (Step S10) and the DSV accumulated value $DSV_{tgt}$ (−3 in this case) immediately before the target is stored in the second DSV accumulated value storage 104. At the same time, $DSV_{t0}$ and $DSV_{t1}$ (−17 and 17 in this case) are stored in the DSV accumulated value storage. The first DSV accumulated value comparator 106 calculates the DSV value of the next DC control block by using the DC control bit "1" that reduces the absolute value at Time t1 as the temporary DC control bit that is temporarily set in Step S4 (cf. FIG. 11 and the first DSV accumulated value comparator). It is assumed that the DSV value from Time t1 to t2 is 21 when the DC control bit is "0" and it is −21 when the DC control bit is "1".

The second DSV accumulated value comparator 107 calculates the DSV accumulated value $DSV_{inv}$ when the DC control bit (which is set to "1" at Time t1) with the target flag is inverted according to the equation (3) (Step S6). In this case, because $DSV_{accum}$ that is shown in the equation (3) is the DSV accumulated value before setting the target flag, and the value of $DSV_{tgt}$, −3, that is stored in the second DSV accumulated value storage 104 is used. The values used for $DSV_{t0}$ and $DSV_{t1}$ are 17 and −17 that are stored in the DSV calculation result storage 103. The value of $DSV_{sum}$ is the DSV accumulated value that is determined based on the temporary DC control bit, and −7 is used in this example.

When these values are substituted to the equation (3) and calculated, the result is:

$$DSV_{inv} = -3 + 17 - 3 - 17 - (-7) = 1$$

The absolute value of the inverted value ($DSV_{inv}$) of the DC control bit with the target flag is smaller than the value of $DSV_{sum}$ (cf. Time t2 in FIG. 11), and therefore the DC control bit with the target flag is inverted (Step S9). The calculation result is also supplied to the first DSV accumulated value storage 10, and the DSV value stored in the first DSV accumulated value storage 105 immediately before t2 is also rewritten from −7 to 1 (not shown). As a result, the DC control bit determination output section 108 outputs the inverted value (full line) of the DC control bit (dotted line) at time t3 of FIG. 11. In the period from time t2 to t3 in FIG. 11, the DSV value is −13 when the DC control bit is "0" and it is 13 when the DC control bit is "1". In this case, because the DSV accumulated value immediately before the time t2 is 1, the DSV value is divergent and therefore the target flag is set therefor. Further, the DC control bit is temporarily set to "0" (cf. FIG. 11 and the output of the first DSV accumulated value comparator 106). $DSV_{accum}$ in the equation (3) is 1, $DSV_{t0}$ and $DSV_{t1}$ are −13 and 13, respectively, and $DSV_{sum}$ is 0. Thus, $DSV_{sum}$ is 2, which is larger absolute value than $DSV_{sum}$. Because the DSV value is smaller without inversion, the DC control bit is not inverted (cf. Time t4 in FIG. 11).

The above operation can be summarized as conditions as follows for each case of when the buffer for storing the DSV accumulated value reaches its limit and when the buffer has not reached its limit:

When the buffer's limit is not reached:

if $DSV_{tgt} > DSV_{sum} > DSV_{inv}$, set the target flag OFF after inversion, if $DSV_{tgt} > DSV_{inv} > DSV_{sum}$, set the target flag OFF without inversion;

When the buffer's limit is reached:

if $DSV_{sum} > DSV_{inv}$, set the target flag OFF after inversion, if $DSV_{inv} > DSV_{sum}$, set the target flag OFF without inversion.

This embodiment uses the above structure for the DC bit generator of the DSV control apparatus to thereby enable the effective reduction of the DSV accumulated value. Further, the structure as shown in FIG. 10 only needs to perform the comparison mainly on two sequencers of when the DC control bit for the target flag is "0" and when it is "1". This enables suitable DSV control simply by increasing the number of buffers for storing data, without significantly increasing the circuit of sequencer for the comparison of the DSV values.

As described in the foregoing, the DSV control method and the control apparatus according to an exemplary embodiment of the present invention does not determine the DC control bit for each DC control block but determines the DC control bit by focusing on the values of the DSV of a plurality of DC control blocks, thereby effectively preventing the DSV from diverging. Further, because the DC control bit can be arbitrarily set to suppress DC component of the signal to be recorded, normal reading can be achieved regardless of the value.

The above embodiment mainly describes the case where the DC control block with different modulation boundary is present, and the value divergence is likely to occur regardless of the value of the DC control bit. However, according to the scope of the invention, the DC control block where the value tends to diverge has the structure that can be corrected based on the DSV value of the subsequent plurality of DC control blocks. Therefore, various changes may be made on algorism of a detailed part.

It is apparent that the present invention is not limited to the above embodiment that may be modified and changed without departing from the scope and spirit of the invention.

What is claimed is:

1. A digital sum value (DSV) control apparatus that inserts a DC control bit for each DC control block, comprising:
   a first DSV accumulated value comparator for setting a target flag to a DC control bit for a first DC control block;
   a second DSV accumulated value comparator for comparing a first DSV accumulated value accumulated and calculated from DSV values of the first DC control block with a second DSV accumulated value accumulated and calculated from DSV values of a plurality of DC control blocks subsequent to the first DC control block; and
   a DC control bit determination output section for determining a value of a DC control bit for the first control block according to an output of the first and the second DSV accumulated value comparators.

2. The DSV control apparatus according to claim 1, wherein
the DC control bit determination output section determines the value of the DC control bit so as to minimize an absolute value of a DSV accumulated value.

3. A DSV control apparatus that inserts a DC control bit for each DC control block, comprising:
a DSV calculator for accumulating and calculating a DSV value of a DC control block and outputting a calculation result;
a first DSV accumulated value comparator for comparing the calculation result of the DSV calculator with a first DSV accumulated value stored in a DSV accumulated value storage that stores the calculation result of the DSV calculator, and setting a target flag to a DC control bit for a DC control block according to a comparison result;
a second DSV accumulated value comparator for calculating a plurality of second DSV accumulated values of a DC control block corresponding to a DC control bit for which the target flag is set and a plurality of DC control blocks subsequent to the DC control block and comparing the plurality of second DSV accumulated values; and
a DC control bit determination output section for determining a value of a DC control bit for which the target flag is set according to an output of the first and the second DSV accumulated value comparators.

4. The DSV control apparatus according to claim 3, wherein
the DC control bit determination output section determines the value of the DC control bit so as to minimize an absolute value of a DSV accumulated value.

5. The DSV control apparatus according to claim 3, wherein
the DSV calculator outputs a first calculation result and a second calculation result based on a DC control bit.

6. The DSV control apparatus according to claim 5, wherein
the first DSV accumulated value comparator compares the first calculation result and the second calculation result output from the DSV calculator with a first DSV accumulated value stored in the DSV accumulated value storage, and when an absolute value of the first calculation result and the second calculation result is larger than an absolute value of the first DSV accumulated value stored in the DSV accumulated value storage, sets the target flag.

7. The DSV control apparatus according to claim 5, wherein
the second DSV accumulated value comparator compares the plurality of second DSV accumulated values based on the first calculation result, the second calculation result output from the DSV calculator, and a third DSV accumulated value stored in the DSV accumulated value storage.

8. A DSV control method that inserts a DC control bit for each DC control block, comprising:
setting a target flag to a DC control bit for a first DC control block;
comparing DSV accumulated values of the first DC control block and a plurality of DC control blocks subsequent to the first DC control block; and
determining a value of a DC control bit for the first control block according to a comparison result of the DSV accumulated values.

9. The DSV control method according to claim 8, wherein
the determination of the DC control bit for the first control block determines the value of the DC control bit so as to minimize an absolute value of a DSV accumulated value.

10. A DSV control method that inserts a DC control bit for each DC control block, comprising:
performing first calculation by accumulating a DSV value of a DC control block;
performing first comparison by comparing a calculation result of the first calculation with a stored first DSV accumulated value;
setting a target flag to a DC control bit for an arbitrary DC control block according to a result of the first comparison;
performing a second comparison by comparing a plurality of second DSV accumulated values of a DC control block corresponding to a DC control bit for which the target flag is set and a plurality of DC control blocks subsequent to the DC control block; and
determining a value of a DC control bit for which the target flag is set according to results of the first and the second comparisons.

11. The DSV control method according to claim 10, wherein
the determination of the DC control bit for a control block for which the target flag is set determines the value of the DC control bit so as to minimize an absolute value of a DSV accumulated value.

12. The DSV control method according to claim 10, wherein
the first calculation is calculation for obtaining a first calculation result and a second calculation result according to a DC control bit.

13. The DSV control method according to claim 12, wherein
the first calculation result and the second calculation result of the first calculation are compared with the stored first DSV accumulated value, and when an absolute value of the first calculation result and the second calculation result is larger than an absolute value of the stored first DSV accumulated value, the target flag is set.

14. The DSV control method according to claim 12, wherein
the second comparison compares the plurality of second DSV accumulated values based on the first calculation result and the second calculation result of the first calculation, and a stored third DSV accumulated value.

* * * * *